United States Patent
Zheng et al.

(10) Patent No.: US 8,860,157 B2
(45) Date of Patent: Oct. 14, 2014

(54) MEMORY CELL WITH PHONON-BLOCKING INSULATING LAYER

(71) Applicant: Seagate Technology LLC, Cupertino, CA (US)

(72) Inventors: Yuankai Zheng, Fremont, CA (US); Xiaohua Lou, Milpitas, CA (US); Wei Tian, Eden Prairie, MN (US); Zheng Gao, San Jose, CA (US); Haiwen Xi, San Jose, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/829,137

(22) Filed: Mar. 14, 2013

(65) Prior Publication Data

US 2013/0200476 A1    Aug. 8, 2013

Related U.S. Application Data

(63) Continuation of application No. 12/947,516, filed on Nov. 16, 2010, now Pat. No. 8,405,171.

(51) Int. Cl.
| | |
|---|---|
| *H01L 43/02* | (2006.01) |
| *G11C 11/16* | (2006.01) |
| *H01F 41/30* | (2006.01) |
| *H01L 43/10* | (2006.01) |
| *H01L 43/08* | (2006.01) |
| *H01L 43/12* | (2006.01) |
| *H01F 10/30* | (2006.01) |

(52) U.S. Cl.
CPC .............. *H01L 43/02* (2013.01); *G11C 11/161* (2013.01); *H01F 41/307* (2013.01); *H01L 43/10* (2013.01); *G11C 11/1675* (2013.01); *H01L 43/08* (2013.01); *H01L 43/12* (2013.01); *H01F 10/30* (2013.01); *G11C 11/1673* (2013.01)

USPC .............. 257/421; 257/E21.002; 257/E29.323

(58) Field of Classification Search
USPC ........................... 257/421, E21.002, E29.323
See application file for complete search history.

(56) References Cited

U.S. PATENT DOCUMENTS

| | | | |
|---|---|---|---|
| 6,365,821 | B1 | 4/2002 | Prasher |
| 6,605,772 | B2 | 8/2003 | Harman et al. |
| 6,714,444 | B2 | 3/2004 | Huai |
| 6,829,161 | B2 | 12/2004 | Huai |
| 6,838,740 | B2 | 1/2005 | Huai |
| 6,847,547 | B2 | 1/2005 | Albert |

(Continued)

FOREIGN PATENT DOCUMENTS

| | | |
|---|---|---|
| JP | 2005136419 | 5/2005 |
| JP | 2010522978 A | 7/2010 |
| JP | 2011151359 | 8/2011 |

OTHER PUBLICATIONS

IL Prejbeanu, M Kerekes, R C Sousa, H Sibuet, O Redon, B Dieny and J P Nozieres, "Thermally assisted MRAM," J. Phys, Conden. Matter 19, 2007, pp. 1-23 IOP Publishing, UK.

*Primary Examiner* — Mamadou Diallo
(74) *Attorney, Agent, or Firm* — Hall Estill Attorneys at Law

(57) ABSTRACT

An apparatus and associated method for a non-volatile memory cell with a phonon-blocking insulating layer. In accordance with various embodiments, a magnetic stack has a tunnel junction, ferromagnetic free layer, pinned layer, and an insulating layer that is constructed of an electrically and thermally insulative material that blocks phonons while allowing electrical transmission through at least one conductive feature.

20 Claims, 5 Drawing Sheets

(56) References Cited

U.S. PATENT DOCUMENTS

| | | |
|---|---|---|
| 6,888,742 B1 | 5/2005 | Nguyen |
| 6,933,155 B2 | 8/2005 | Albert |
| 6,958,927 B1 | 10/2005 | Nguyen |
| 6,967,863 B2 | 11/2005 | Huai |
| 6,985,385 B2 | 1/2006 | Nguyen |
| 6,992,359 B2 | 1/2006 | Nguyen |
| 7,057,921 B2 | 6/2006 | Valet |
| 7,088,609 B2 | 8/2006 | Valet |
| 7,110,287 B2 | 9/2006 | Huai |
| 7,126,202 B2 | 10/2006 | Huai |
| 7,161,829 B2 | 1/2007 | Huai |
| 7,190,611 B2 | 3/2007 | Nguyen |
| 7,230,845 B1 | 6/2007 | Wang |
| 7,233,039 B2 | 6/2007 | Huai |
| 7,241,631 B2 | 7/2007 | Huai |
| 7,242,045 B2 | 7/2007 | Fujioka |
| 7,242,048 B2 | 7/2007 | Huai |
| 7,245,462 B2 | 7/2007 | Huai |
| 7,342,169 B2 | 3/2008 | Venkatasubramanian et al. |
| 7,369,427 B2 | 5/2008 | Diao |
| 7,430,135 B2 | 9/2008 | Huai |
| 7,486,551 B1 | 2/2009 | Li |
| 7,486,552 B2 | 2/2009 | Apalkov |
| 7,489,541 B2 | 2/2009 | Pakala |
| 7,518,835 B2 | 4/2009 | Huai |
| 7,576,956 B2 | 8/2009 | Huai |
| 2005/0150535 A1 | 7/2005 | Samavedam |
| 2005/0150537 A1 | 7/2005 | Ghoshal |
| 2009/0050991 A1 | 2/2009 | Nagai |
| 2009/0302403 A1 | 12/2009 | Nguyen |
| 2010/0092803 A1 | 4/2010 | Yuasa et al. |

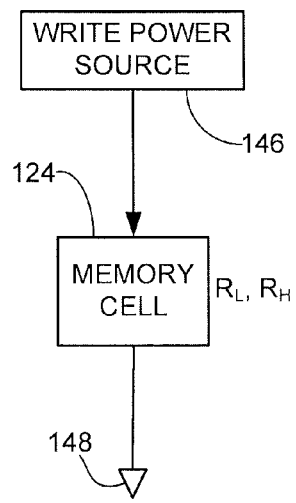
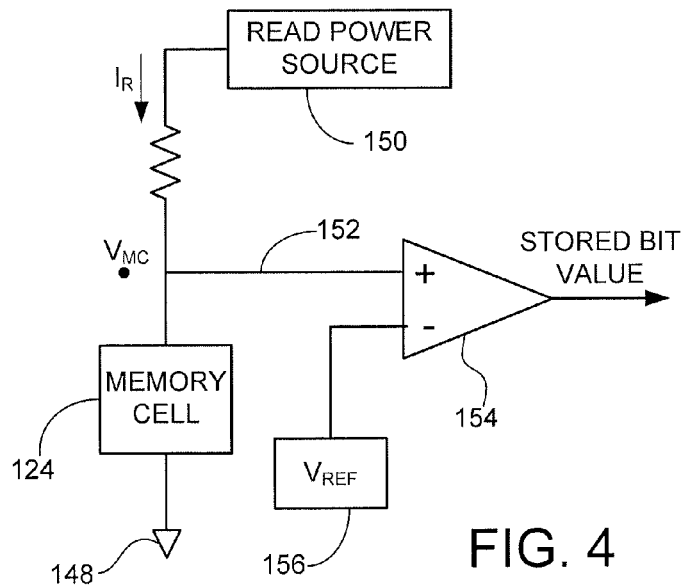
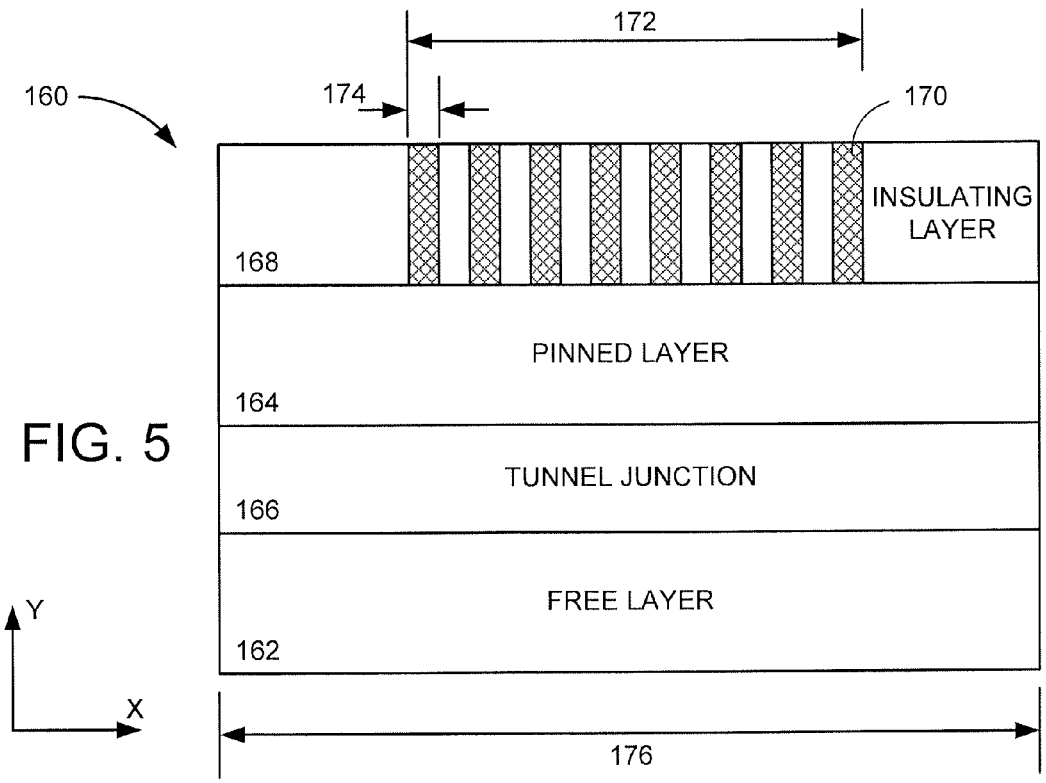

US 8,860,157 B2

MEMORY CELL WITH PHONON-BLOCKING INSULATING LAYER

RELATED APPLICATION

This application is a continuation of copending U.S. patent application Ser. No. 12/947,516 filed Nov. 16, 2010.

SUMMARY

Various embodiments of the present invention are generally directed to a non-volatile memory cell configured with a phonon-blocking insulating layer.

In accordance with various embodiments, a magnetic stack has a tunnel junction, ferromagnetic free layer, pinned layer, and an insulating layer that is constructed of an electrically and thermally insulative material that blocks phonons while allowing electrical transmission through at least one conductive feature.

These and other features and advantages which characterize the various embodiments of the present invention can be understood in view of the following detailed discussion and the accompanying drawings.

BRIEF DESCRIPTION OF THE DRAWINGS

FIG. 3 generally illustrates a manner in which data can be written to a memory cell of the memory array.

FIG. 4 generally illustrates a manner in which data can be read from the memory cell of FIG. 3.

FIG. 5 shows an exemplary memory stack constructed and operated in accordance with the various embodiments of the present invention.

DETAILED DESCRIPTION

The present disclosure generally relates to non-volatile memory cells, such as magnetic and spin torque random access memory (MRAM and STRAM) stacks. Solid state non-volatile memory is a developing technology aimed at providing reliable data storage and faster data transfer rates in ever decreasing form factors. However, as form factors of storage devices decrease, the required anisotropic field needed to maintain memory function increases. Such anisotropic field increase corresponds to practical difficulties like increased switching current and low operating margin. While recent efforts have revolved around thermally assisting a solid state cell to reduce the required switching current, the high thermal conductivity of most solid state memory materials dissipates any applied heat.

Accordingly, a solid state non-volatile memory cell with a ferromagnetic free layer and pinned layer separated by a tunnel junction is coupled to an insulating layer that exhibits thermal and electrical insulative properties. Such an insulating layer can retain any applied heat in the memory cell while allowing electrical transmission through dimensioned conductive features that extend through the insulating layer. The predetermined dimension of the conductive features block phonons but allow electrical signal transmission, which provides normal memory cell operation with added heat retention and reduced switching current.

Figure 1:
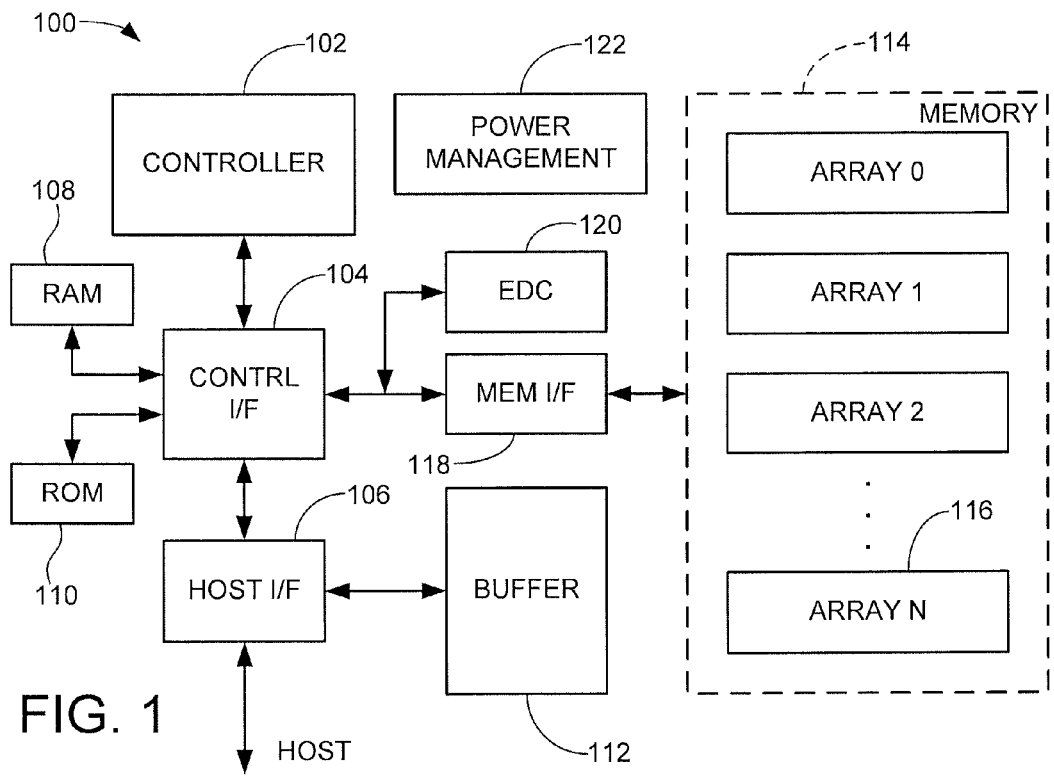
FIG. 1 is a generalized functional representation of an exemplary data storage device constructed and operated in accordance with various embodiments of the present invention.

A functional block representation of an exemplary data storage device 100 is displayed in FIG. 1 as constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
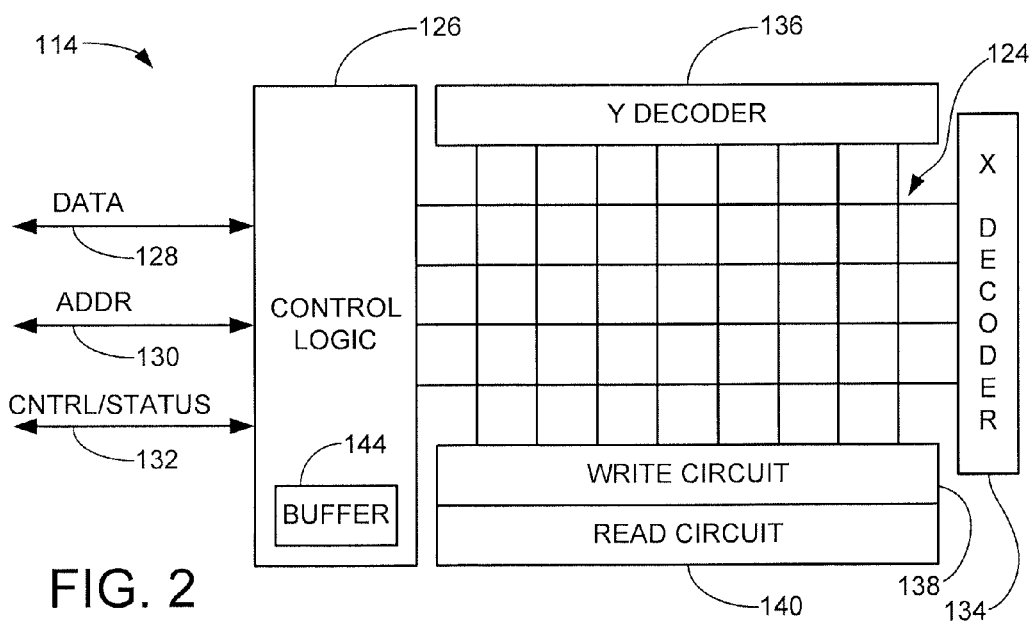
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of memory cells 124, accessible by various row (word) and column (bit) lines. The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Data are written to the respective memory cells 124 as generally depicted in FIG. 3. Generally, a write power source 146 applies the necessary input (such as in the form of current, voltage, magnetization, etc.) to configure the memory cell 124 to a desired state. It can be appreciated that FIG. 3 is merely a representative illustration of a bit write operation. The configuration of the write power source 146, memory cell 124, and reference node 148 can be suitably manipulated to allow writing of a selected logic state to each cell.

As explained below, in some embodiments the memory cell 124 takes a modified STRAM configuration, in which case the write power source 146 is characterized as a current driver connected through a memory cell 124 to a suitable reference node 148, such as ground. The write power source 146 provides a stream of power that is spin polarized by moving through a magnetic material in the memory cell 124. The resulting rotation of the polarized spins creates a torque that changes the magnetic moment of the memory cell 124.

Depending on the magnetic moment, the cell 124 may take either a relatively low resistance ($R_L$) or a relatively high resistance ($R_H$). While not limiting, exemplary $R_L$ values may be in the range of about 100 ohms ($\Omega$) or so, whereas exemplary $R_H$ values may be in the range of about 100K$\Omega$ or so. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). The voltage drop across the memory cell (voltage $V_{MC}$) is sensed via path 152 by the positive (+) input of a comparator (sense amplifier) 154. A suitable reference (such as voltage reference $V_{REF}$) is supplied to the negative (−) input of the comparator 154 from a reference source 156.

The voltage reference $V_{REF}$ can be selected from various embodiments such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

FIG. 5 generally illustrates a non-volatile memory cell 160 in accordance with various embodiments of the present invention. The cell 160 has a ferromagnetic free layer 162, a pinned layer 164, and a tunnel junction 166 that separates the layers 162 and 164 while allowing a magnetoresistive effect to be programmed and read from the cell 160. The pinned layer 164 is set and maintained in a predetermined magnetization by an insulating layer 168. It can be appreciated that the insulating layer 168 is not limited to a particular material or construction and can be any structure that sets the magnetization of the pinned layer 164, such as an antiferromagnetic (AFM), synthetic antiferromagnet, and hard magnetic layer.

The insulating layer 168 can further be constructed of materials that exhibit minimal thermal and electrical conductivity, such as, but not limited to, NiO. Such a configuration of the insulating layer 168 provides heat retention for the cell 160 that can prove beneficial in lowering the switching current required to program the free layer to a selected magnetization. The insulating layer 168 can allow electrical signal transmission through one or more conductive features 170 that are dimensioned to allow electron transfer while blocking phonon transfer. The conductive features 170 can be further filled with material that provides additional phonon blocking characteristics in combination with electrical conductivity.

Constructing the insulating layer with NiO allows utilization in a variety of solid state memory configurations, such as magnetic and spin torque random access memory (MRAM and STRAM). However, the various applications can require modification of the pinning layer 168 shown in FIG. 5 to provide desired operation. One such modification is depositing the insulating layer with a predetermined thickness, as measured along the Y axis, to generate the prerequisite magnetic field to reliably set and maintain the magnetization of the pinned layer 164.

An increased thickness for the insulating layer can provide enhanced operation for STRAM applications that involve current passing through the various layers of the cell 160. Yet, the greater thickness can prove problematic for field programmed MRAM applications which can be affected by the increased resistance associated with a thicker pinning layer 168. For such MRAM applications, a phonon-blocking electron transmitting (PBET) material can be used to construct the AFM pinning layer 168 with electrical and thermal insulating characteristics.

The operation of the cell 160 as either an MRAM or STRAM cell does not affect the configuration of the conductive features 170 that can be oriented in a designated conductive region 172 of the pinning layer 168. As shown, a plurality of isolated conductive features each have a uniform width 174, as measured along the X axis, that provides electrical conductivity and phonon blocking due to the difference in wavelength between electron and phonon transmission. While any number of conductive features 170 can be present in the insulative layer 168, in some embodiments the conductive region extends matches the width of the cell 176 which would provide room for more conductive features 170 and a higher electron transfer capability.

Figure 6:
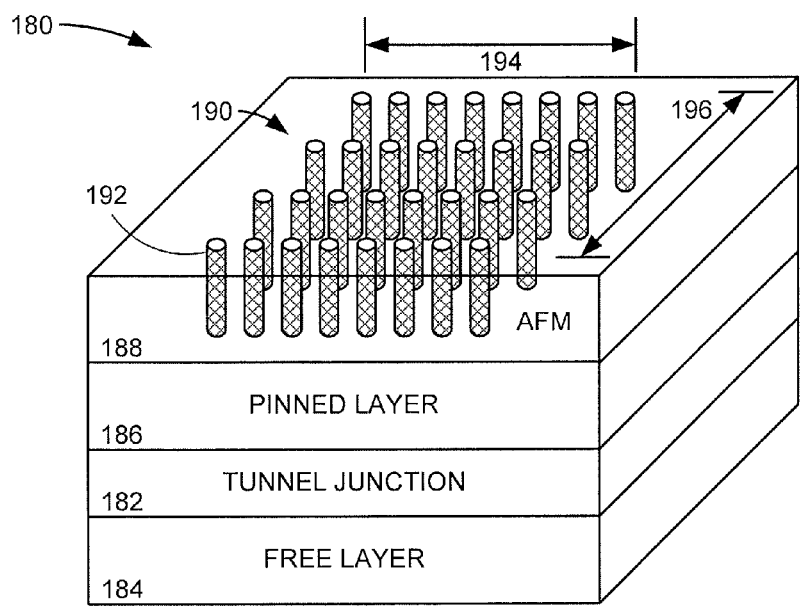
FIG. 6 illustrates an isometric representation of an exemplary memory stack constructed and operated in accordance with the various embodiments of the present invention.

FIG. 6 illustrates an isometric view of an exemplary memory cell 180 that has a tunnel junction 182 disposed between a magnetic free layer 184 and a pinned layer 186. An insulating layer 188 coupled to the pinned layer 184 is configured as an AFM that uses exchange bias field to maintain the magnetization of the pinned layer 186. The insulating layer 188 has a predetermined conductive region 190 that has a plurality of conductive features 192 that are each surrounded by the insulating layer material which acts to electrically and thermally isolate each feature 192. The conductive region 190 extends for a selected width 194 and length 196 in a predetermined pattern, as desired.

In operation, the tunnel junction 182 can generate heat that is retained in the cell 180 by the insulating layer 188 which in turn lowers the required programming current/field. In the event that a PBET material is used as the insulating layer 188, the PBET can also generate heat due to relatively higher resistance. With the plurality of conductive features 192 in the insulating layer 188, the cell 180 has enough electrical conductivity to operate with current or field programming. That is, the conductive features 192 can transmit enough electrical current density to operate as a STRAM, phase change RAM, and resistive RAM cell. The insulative characteristics of the insulating layer 188 also do not hamper operation of the cell 180 as a field programmed MRAM or STRAM cell.

In some embodiments, a multitude of insulating layers are provided to further retain any heat in the memory cell 180. One such embodiment configures a second insulative layer contactingly adjacent the free layer 184 so that insulating material is present on the top and bottom surfaces of the cell 180. In another embodiment, a second insulating layer can be positioned directly adjacent the first insulating layer 188, as displayed in FIG. 7, to provide additional operational benefits.

Figure 7:
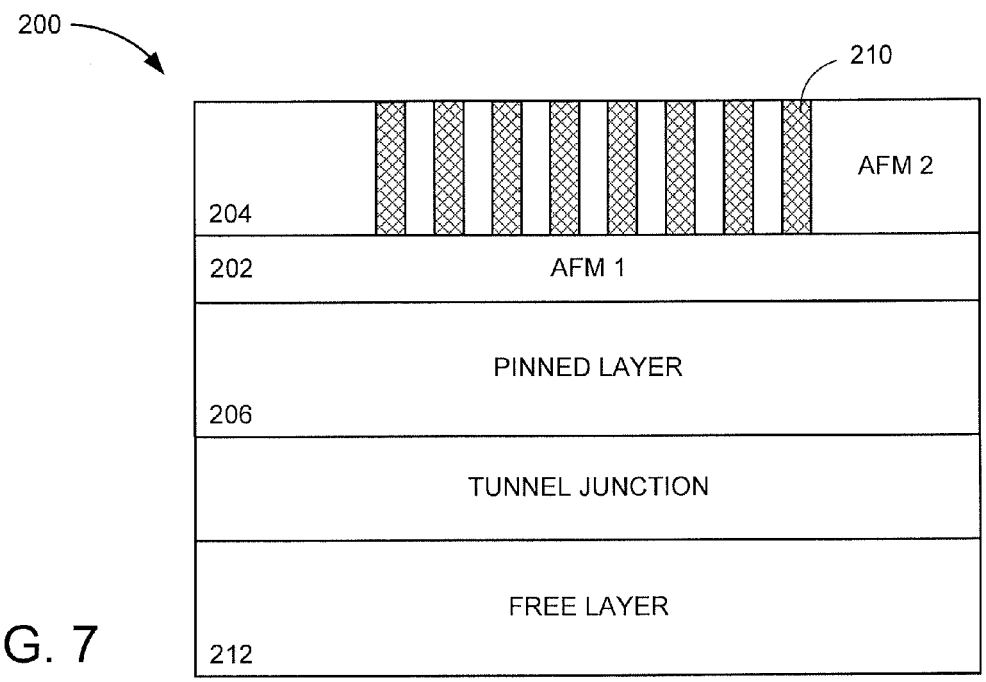
FIG. 7 displays an exemplary alternative construction of a memory stack.

FIG. 7 generally illustrates an exemplary memory cell 200 that has a first and second insulating layer 202 and 204 that are each configured as AFM layers. The insulating layers 202 and 204 can individually or collectively maintain a predetermined magnetization in the pinned layer 206. The dual insulating layers 202 and 204 can provide enhanced spin torque and reduced programming field/current in conjunction with thermal assistance supplied to the cell 200. The first insulating layer 202 can have a thickness that is less than and a density that is greater than the second insulating layer 204 to provide enhanced operation with little added cell 200 size.

The dual insulating layers 202 and 204 allows for both a strong insulating material, such as NiO, to be used in the first insulating layer 202 in conjunction with a strong phonon-blocking material, such as PBET, in the second insulating layer 204 to provide operational characteristics of both materials. The dense insulating material in the first insulating layer 202 can further be configured to spin incoming current and fields to a predetermined orientation to be used for STRAM programming of the free layer 206. Such a first insulating layer 202 will also block the magnetic conductivity of the conductive features 210 from diffusing any magnetization from the free or pinned layers 212 or 206.

Figure 8A:
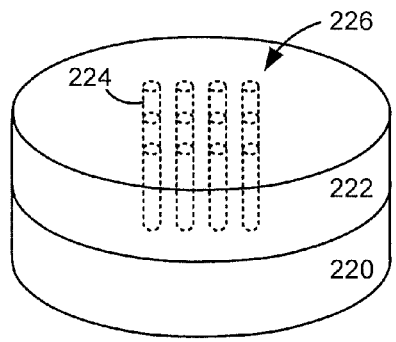
FIGS. 8A-8C show exemplary steps capable of forming conductive features in an insulating layer.
Figure 8B:
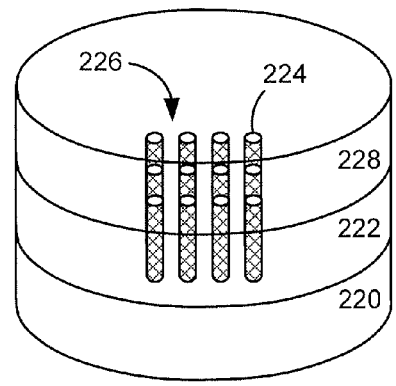
Figure 8C:
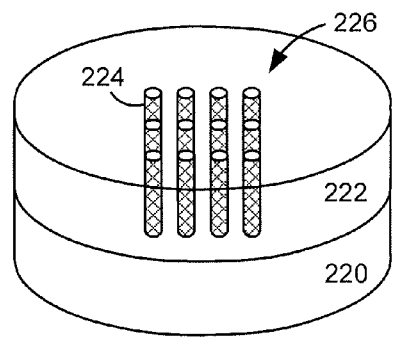

FIGS. 8A-8C display exemplary steps that can be taken to form the conductive features of the memory cells of FIGS. 5-7. In FIG. 8A, a seed layer 220 of approximately 3 to 10 angstroms and an insulating layer 222 of approximately 20 to 200 angstroms are successively deposited onto each other with a uniform predetermined shape. As can be appreciated, the shape and deposition process are not limited as any shape and process, such as vapor deposition and crystalline growth, used to construct the various layers is contemplated and acceptable. The insulating layer 222 is either formed or processed with conductive features 224 that are isolated hollow voids in a predetermined conductive region 226 of the insulative material of layer 222.

An electron conducting material is then deposited as a conducting layer 228 onto the insulating layer 222 to encompass and fill each conductive feature 224 in the conductive region 226. With the conductive features 224 filled with electrically conductive and thermally insulative phonon-blocking material, the conducting layer 228 can be removed to reveal the conductive features 224 occupying portions of the insulating layer 222, as shown in FIG. 8C.

In various embodiments, the seed layer 220 is a dense insulating layer that is thinner than the insulating layer 222. Such an embodiment could be constructed by configuring the seed layer 220 as an insulating layer through vapor deposition of thermally and electrically insulative material with low Argon pressure that will result in a dense layer. The insulating and conducting layers 222 and 228 can be then deposited in the presence of less Argon pressure to provide a varying density in comparison to the seed layer 220. An annealing process can be completed to set the configuration of the layers 220, 222, and 228 to be followed by conductive feature formation accomplished by applying voltage through the layers and injecting conducting layer material into the insulating layer 222.

As such, the conductive features 224 can be either formed in a predetermined pattern, as shown in FIG. 8C, or randomly injected as conductive filaments in the insulating layer. While the practice of injecting conductive material into the insulative layer 222 is similar to the operation of resistive RAM memory, the conductive filaments do not provide any memory capabilities due to the permanent formation of the filaments that cannot be removed, as in RRAM, to store logical states. However, it is contemplated that the insulative layer 222, either alone or in combination with dense insulating seed layer 220, can be used to retain heat in an RRAM memory cell to provide reduced programming requirements.

Whether the conductive features 224 are precisely formed or injected into the insulative layer 222, the features 224 are dimensioned to be electrically conductive and phonon-blocking. Such dimensioning can be achieved by passing a predetermined voltage through the conductive layer 228 or by masking and etching a particular width for each feature 224. The dimensioning the width of the conductive feature 224 functions to allow the small wavelength of electrical signals to pass while blocking the relatively large wave length of phonons.

Figure 9:
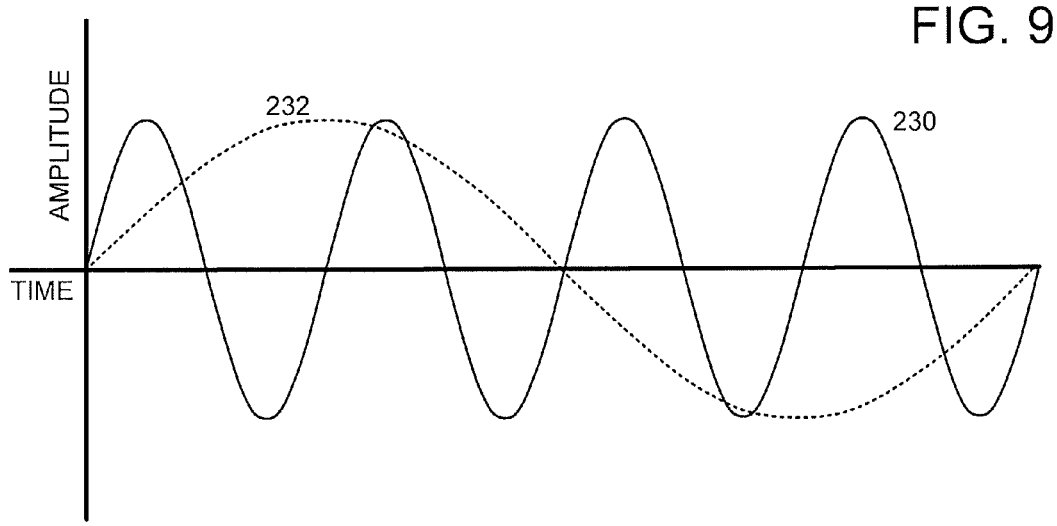
FIG. 9 graphs exemplary operational data relating to the transmission of phonons and electrical signals.

FIG. 9 graphically compares exemplary electrical 230 and phonon 232 signals with dissimilar wavelengths that correspond to variable transmission through a conductive feature. The electrical signal 230 has a wavelength that is less than the phonon signal wavelength which allows for transmission through a conductive feature filled with PBET material while blocking the larger wavelengths of the phonon signal 232. Accordingly, the conductive features shown in the insulating layers of FIGS. 5-7 can be configured to block phonon signals while allowing the transmission of electrical signals.

Figure 10:
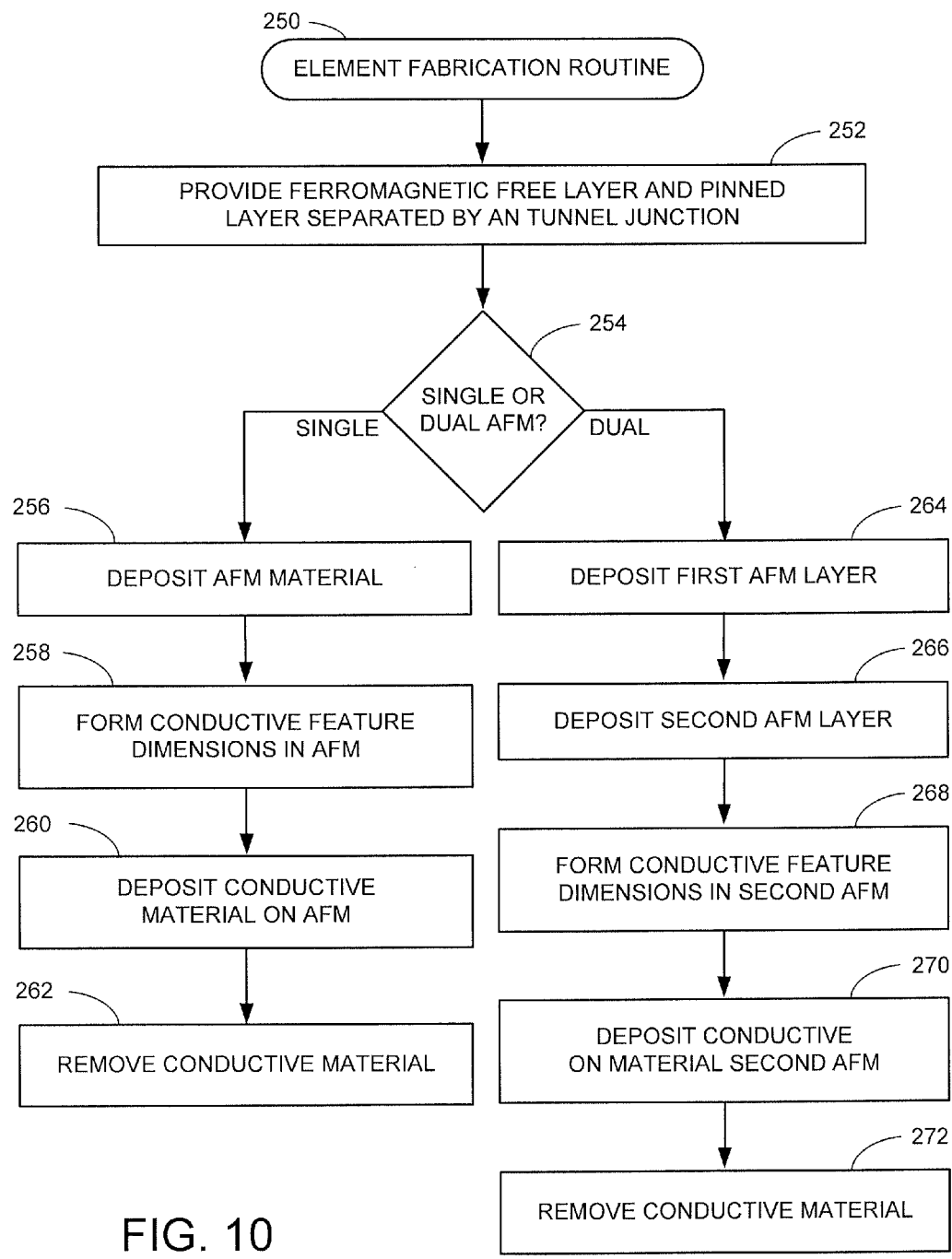
FIG. 10 provides a flow diagram and corresponding illustrative magnetic stacks of an exemplary CELL FABRICATION routine conducted in accordance with the various embodiments of the present invention.

FIG. 10 provides a flow chart of a cell fabrication routine 250 that form an exemplary memory cell in accordance with the various embodiments of the present invention. The routine 250 initially provides a ferromagnetic free layer and pinned layer separated by a tunnel junction in step 252. Decision 254 then determines the number of insulating layers to be included in the memory cell. For example, FIG. 5 has a single insulating layer acting as an AFM while FIG. 7 has dual insulating layers that each act as AFMs. However, it should be noted that while AFM insulating layers are explicitly recited in the various figures, such configuration is not limited as other magnetic pinning structures, such as a synthetic AFM multi-layer, could be used.

If a single insulating layer is desired from decision 254, an AFM material is deposited in step 256 onto a seed layer, as shown in FIG. 8A. Step 258 proceeds to form hollow conductive features of a particular dimension in the deposited AFM insulating layer. A conductive material is then deposited onto the insulating AFM layer in step 260 to fill the hollow conductive features and subsequently removed in step 262 to leave the insulating layer with solid conductive features. As discussed above, the AFM and conductive materials can be selected and optimized to provide varying memory cell operation.

With a plurality of insulating AFM layers resulting from decision 254, a first insulating AFM layer of NiO is provided with a first density in step 264 followed by step 266 which deposits a second insulating AFM layer of PBET with a lesser second density. A conductive material layer is then deposited onto the second insulating layer in step 268 to be followed by passing a predetermined voltage through the layers in step 270 to inject the conductive material into the second insulating layer as conductive features that have a predetermined width that allows electrical signal transmission while blocking phonons.

Finally, the conductive material layer is removed in step 272 and the resultant memory cell is ready for magnetic current or field programming. It should be noted that the fabrication routine 250 is not limited to the steps and corresponding exemplary magnetic stacks shown in FIG. 10. The various steps can be modified or omitted while new steps can be added, as desired. As an example, steps 266-272 can replace steps 256-262 to create a single insulating AFM layer with injected conductive features of a particular dimensioned width. Furthermore, additional insulating layers and conductive features can be formed and configured before or after decision 254.

As can be appreciated by one skilled in the art, the various embodiments illustrated herein provide advantages in both memory cell structure and operation. The ability to reduce the required switching field/current with thermal assistance improves memory cell function and the practical applications in dense memory arrays. Moreover, the ability to retain heat in the cell through phonon-block while allowing electrical signal transmission provides increased heating efficiency without a loss in programming speed or reliability. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising a tunnel junction, ferromagnetic free layer, pinned layer, and an insulating layer, the insulating layer comprising an antiferromagnet (AFM) material and a conductive region comprising a plurality of separate electrically conductive features each having a width less than a phonon signal wavelength.

2. The apparatus of claim 1, wherein each conductive feature is dimensioned to allow electrical conductivity while blocking phonon transmission.

3. The apparatus of claim 1, wherein the conductive region has a first width and length that are respectively smaller than a second width and length of the insulating layer.

4. The apparatus of claim 1, wherein the conductive region is shaped in a substantially rectangular pattern.

5. The apparatus of claim 1, wherein the insulating layer is shaped to be substantially circular.

6. The apparatus of claim 1, wherein at least one conductive feature is shaped to be substantially circular with a uniform diameter through the insulating layer.

7. The apparatus of claim 1, wherein each conductive feature has a lower magnetic field resistance than the insulating layer.

8. The apparatus of claim 1, wherein the insulating layer comprises NiO.

9. The apparatus of claim 1, wherein the insulating layer comprises a phonon-blocking electron transmitting (PBET) material.

10. The apparatus of claim 1, wherein at least one conductive feature comprises phonon-blocking electron transmitting (PBET) material.

11. The apparatus of claim 1, wherein at least one conductive feature continuously extends from the pinned layer through the insulating layer.

12. A method comprising:
    forming a tunnel junction, ferromagnetic free layer, pinned layer, and insulating layer, the insulating layer comprising a antiferromagnet (AFM) material; and
    configuring the insulating layer with a conductive region comprising a plurality of separate electrically conductive features each having a width less than a phonon signal wavelength.

13. The method of claim 12, wherein each conductive feature is formed by passing a predetermined current through a conductive material to inject the conductive material into the AFM material.

14. The method of claim 12, wherein each conductive feature is formed by removing portions of the insulating layer and filling the removed portions with phonon-blocking electron transmitting (PBET) material.

15. The method of claim 12, wherein the insulating layer retains heat proximal the tunnel junction to lower the current required to program a magnetization in the ferromagnetic free layer.

16. A data storage element comprising a magnetic stack comprising a tunnel junction, ferromagnetic free layer, pinned layer, first insulating layer, and second insulating layer, the second insulating layer comprising an antiferromagnet (AFM) material and a conductive region comprising a plurality of separate electrically conductive features each having a width less than a phonon signal wavelength.

17. The data storage element of claim 16, wherein the plurality of separate electrically conductive features are arranged in a predetermined pattern that has a selected length and width through only the second insulating layer.

18. The data storage element of claim 16, wherein the plurality of separate electrically conductive features are randomly positioned within the second insulating layer.

19. The data storage element of claim 16, wherein the first and second insulating layers are contactingly adjacent and have differing densities.

20. The data storage element of claim 16, wherein a first insulating layer is contactingly adjacent the pinned layer and a second insulating layer is contactingly adjacent the free layer.

* * * * *